(12) United States Patent
Kim

(10) Patent No.: US 9,502,389 B2
(45) Date of Patent: Nov. 22, 2016

(54) DISPLAY DEVICE USING SEMICONDUCTOR LIGHT EMITTING DEVICE

(71) Applicant: LG ELECTRONICS INC., Seoul (KR)

(72) Inventor: Chisun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 41 days.

(21) Appl. No.: 14/575,327

(22) Filed: Dec. 18, 2014

(65) Prior Publication Data

US 2015/0255439 A1 Sep. 10, 2015

(30) Foreign Application Priority Data

Mar. 5, 2014 (KR) .................. 10-2014-0026195

(51) Int. Cl.
*H01L 25/075* (2006.01)
*H01L 33/62* (2010.01)

(52) U.S. Cl.
CPC ........... *H01L 25/0753* (2013.01); *H01L 33/62* (2013.01); *H01L 2924/0002* (2013.01)

(58) Field of Classification Search
CPC .............. H01L 51/0072; H01L 33/62; H01L 51/0058; H01L 51/5056; H01L 51/5072
USPC .................................. 257/13, 88, 89; 438/28
See application file for complete search history.

(56) References Cited

U.S. PATENT DOCUMENTS

| | | |
|---|---|---|
| 2002/0163614 A1 | 11/2002 | Hinata et al. |
| 2007/0290213 A1* | 12/2007 | Kobayashi .......... H01L 51/5265 257/79 |
| 2008/0035935 A1 | 2/2008 | Shum |
| 2011/0140078 A1* | 6/2011 | Hsu ...................... H01L 25/0753 257/13 |
| 2011/0255044 A1 | 10/2011 | Kim et al. |
| 2011/0304601 A1 | 12/2011 | Niioka et al. |
| 2012/0127403 A1 | 5/2012 | Muneyoshi et al. |
| 2013/0236997 A1* | 9/2013 | Lee ......................... H01L 33/48 438/27 |

* cited by examiner

*Primary Examiner* — Andy Huynh
(74) *Attorney, Agent, or Firm* — Birch, Stewart, Kolasch & Birch, LLP

(57) ABSTRACT

Discussed is a display device including a wiring substrate having a first electrode and a second electrode formed on different surfaces, a conductive adhesive layer configured to cover the wiring substrate, and a sub-pixel portion coupled to the conductive adhesive layer to have a plurality of light emitting portions that emit different color lights, wherein the sub-pixel portion has a plurality of first conductive electrodes corresponding to the plurality of light emitting portions, and a second conductive electrode as a common electrode for the plurality of light emitting portions, and wherein an electrode hole is formed on the wiring substrate to electrically connect the second electrode to the second conductive electrode.

17 Claims, 21 Drawing Sheets

1156c 1156b 1156a 1153 1152

DISPLAY DEVICE USING SEMICONDUCTOR LIGHT EMITTING DEVICE

CROSS-REFERENCE TO RELATED APPLICATIONS

This application claims priority to and the benefit of Korean Patent Application No. 10-2014-0026195, filed on Mar. 5, 2014, the contents of which is herein expressly incorporated by reference in its entirety.

BACKGROUND OF THE INVENTION

1. Field of the Invention

Embodiments of the invention relate to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition to this, it may be possible to conceive the structure of further simplifying a fabrication process in a flexible display using semiconductor light emitting devices.

SUMMARY OF THE INVENTION

Embodiments of the invention provide a display device in which semiconductor light emitting devices are arranged with a fine pitch.

Embodiments of the invention provide a flip chip type semiconductor light emitting device with a new structure.

In order to accomplish the foregoing task of the embodiments of the invention, a display device according to an embodiment of the invention may include a wiring substrate having a first electrode and a second electrode formed on different surfaces, a conductive adhesive layer configured to cover the wiring substrate, and a sub-pixel portion coupled to the conductive adhesive layer to have a plurality of light emitting portions that emit different color lights, wherein the sub-pixel portion has a plurality of first conductive electrodes corresponding to the plurality of light emitting portions, and wherein a second conductive electrode as a common electrode for the plurality of emitting portions, and an electrode hole is formed on the wiring substrate to electrically connect the second electrode to the second conductive electrode.

According to an example associated with the embodiments of the invention, a semiconductor light emitting device having the plurality of first conductive electrodes and the second conductive electrode may be disposed on the sub-pixel portion, and the semiconductor light emitting device may have a plurality of first conductive semiconductor layers on which the plurality of first conductive electrodes are formed, respectively, and a second conductive semiconductor layer on which the second conductive electrode is formed.

The second conductive semiconductor layer may be a single semiconductor layer, and the plurality of first conductive semiconductor layers may be overlapped with the single semiconductor layer. Active layers may be formed between the second conductive semiconductor layer and the plurality of first conductive semiconductor layers, respectively, to sequentially form the plurality of light emitting portions along a direction parallel to the single semiconductor layer.

According to another example associated with the embodiments of the invention, the second conductive electrode may be a single conductive electrode.

The second semiconductor layer may include an n-type semiconductor layer and an n-type contact layer, and at least one of a thickness of the n-type contact layer, a width of the n-type contact layer, and a distance between the n-type contact layer and the plurality of first conductive electrodes may be formed differently on the plurality of light emitting portions.

The plurality of light emitting portions may be formed to emit red light, green light and blue light, respectively.

According to another example associated with the embodiments of the invention, the first electrode and second electrode may have first electrode lines and second electrode lines, respectively, and the first electrode lines and second electrode lines may be formed in directions crossing each other, and at least part of the first electrode lines and second electrode lines may be electrically connected to the sub-pixel portion.

The sub-pixel portion may be electrically connected to a plurality of electrode lines of the first electrode lines, and electrically connected to a single electrode line of the second electrode lines.

According to another example associated with the embodiments of the invention, the plurality of first conductive electrodes may be aligned along a virtual line, and the second conductive electrode may be disposed offset from the virtual line.

The sub-pixel portion may be either one of a first sub-pixel portion and a second sub-pixel portion adjacent to each other, and a second conductive electrode of the first sub-pixel portion and a second conductive electrode of the second sub-pixel portion may be sequentially arranged along a direction perpendicular to the line. The electrode hole may be extended from the first sub-pixel portion to the second sub-pixel portion to cover the second conductive electrode of the first sub-pixel portion and the second conductive electrodes of the second sub-pixel portion.

According to another example associated with the embodiments of the invention, the sub-pixel portion may be either one of a first sub-pixel portion and a second sub-pixel portion that are adjacent to each other, and the first sub-pixel portion and second sub-pixel portion may be formed to share a single second conductive electrode.

The first sub-pixel portion and second sub-pixel portion may be formed in a horizontal symmetry or both vertical and horizontal symmetry around the single second conductive electrode. The electrode hole may be formed to correspond to the single second conductive electrode.

Furthermore, according to the embodiments of the invention, there is disclosed a display device, including a wiring substrate having a first electrode and a second electrode, a conductive adhesive layer configured to cover the wiring substrate; and a semiconductor light emitting device coupled to the conductive adhesive layer, and configured to emit light from a plurality of light emitting portions separated from one another, respectively, wherein the semiconductor light emitting device includes a plurality of first conductive semiconductor layers corresponding to the plurality of light emitting portions, respectively, a second conductive semiconductor layer overlapped with the plurality of first conductive semiconductor layers, a plurality of first conductive electrodes electrically connected to the first electrode, and formed on the plurality of first conductive semiconductor layers, respectively, and a second conductive electrode electrically connected to the second electrode and deposited on the second conductive semiconductor layer.

In addition, according to the embodiments of the invention, there is disclosed a semiconductor light emitting device, including a plurality of first conductive semiconductor layers, a second conductive semiconductor layer overlapped with the plurality of first conductive semiconductor layers, a plurality of active layers formed between the second conductive semiconductor layer and the plurality of first conductive semiconductor layers, respectively, a plurality of first conductive electrodes formed on the plurality of first conductive semiconductor layers, respectively, and a single second conductive electrode deposited on the second conductive semiconductor layer.

According to the embodiments of the invention having the foregoing configuration, a semiconductor light emitting device may be disposed at a fine pitch, and a conductive adhesive layer has flexibility, thereby implementing a rollable display device.

Furthermore, according to the embodiments of the invention, it may be possible to implement a display device requiring one or less via hole per each pixel through a flip chip type semiconductor light emitting device with a new structure.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
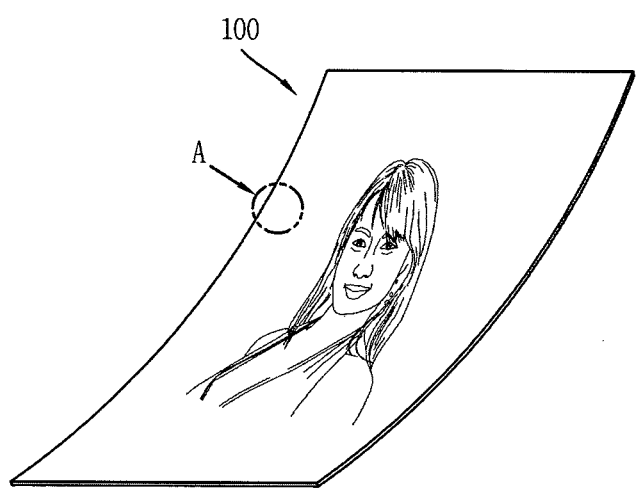
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for ease of description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated for ease of explaining the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
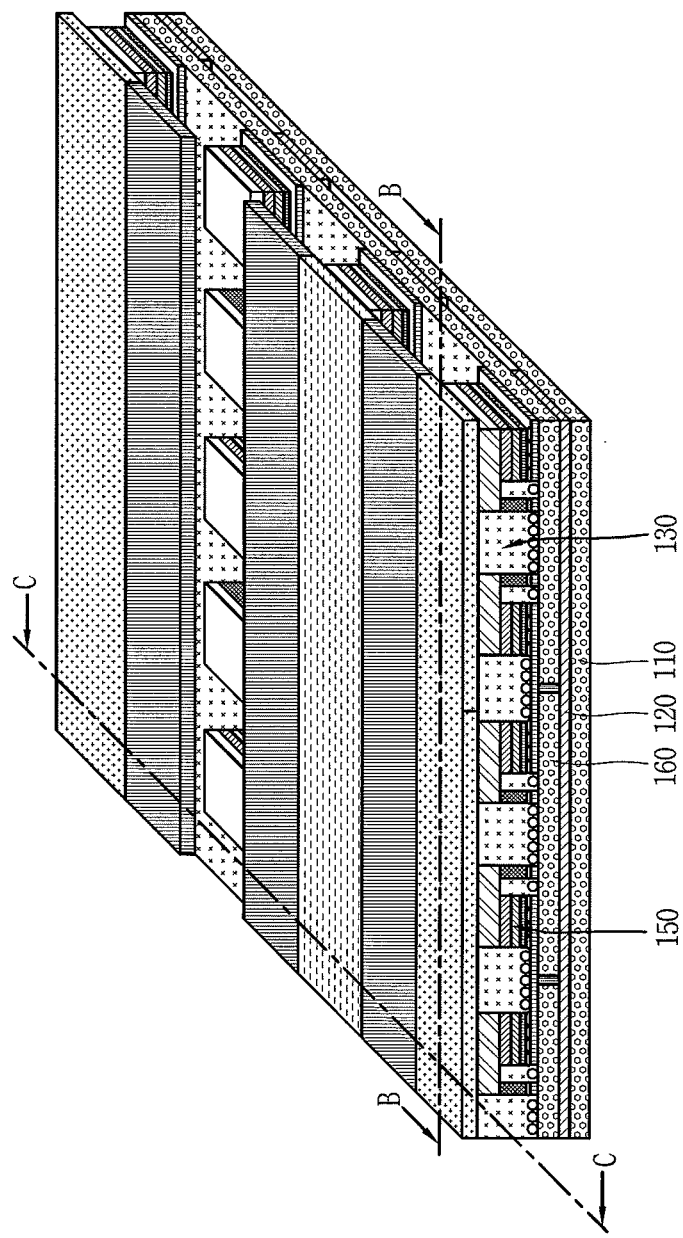
FIG. 2 is a partial enlarged view of portion "A" in FIG. 1, and FIGS. 3A and 3B are cross-sectional views taken along lines B-B and C-C in FIG. 2.
Figure 3A:
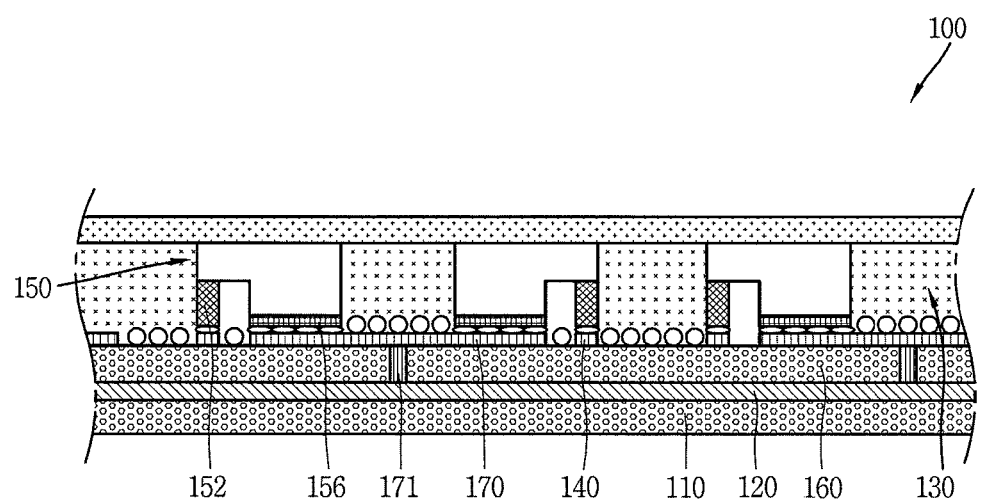
Figure 3B:
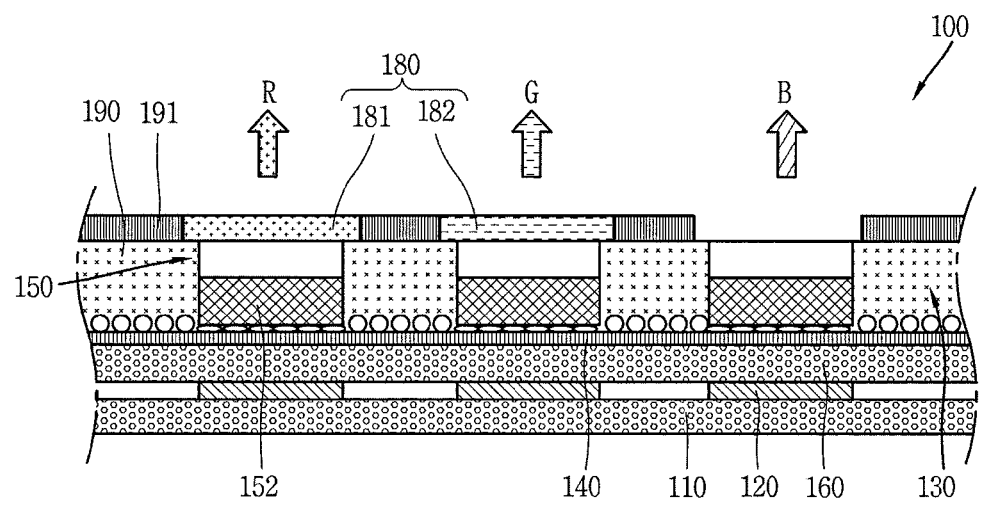
Figure 4:
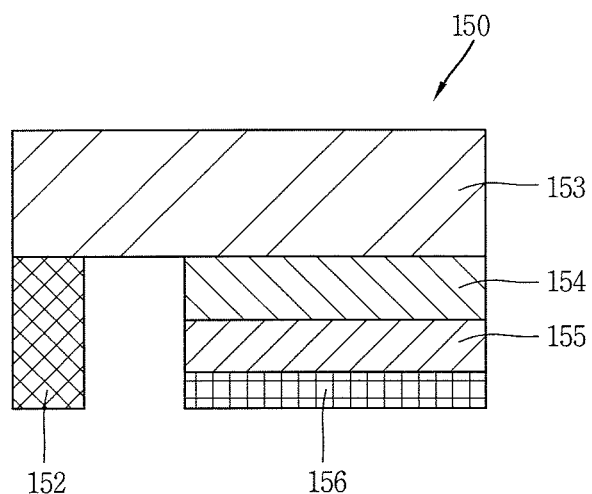
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device by way of example. However, the following illustration may be also applicable to an active matrix (AM) type semiconductor light emitting device in other embodiments.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, as a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiments of the invention may not be necessarily limited to this. For example, it may be possible to also have a structure in which a layer performing a specific function is formed between the insulating layer 160 and conductive adhesive layer 130, or the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. In this instance, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiments of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices may be grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, in one embodiment of the invention, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or a green phosphor layer 182 constituting individual pixels. The phosphor layer 180 may be other color phosphor layers.

In other words, a red phosphor 181 capable of converting blue light into red (R) light may be deposited on the blue semiconductor light emitting device at a location implementing a red sub-pixel, and a green phosphor 182 capable of converting blue light into green (G) light may be deposited on the blue semiconductor light emitting device at a location implementing a green sub-pixel. Furthermore, only the blue semiconductor light emitting device may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiments of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiments of the invention may not be necessarily limited to this, and another structure for implementing blue, red and green may be also applicable thereto.

Figure 5A:
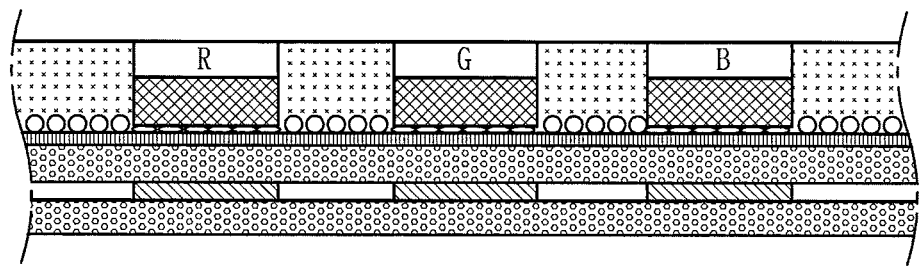
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
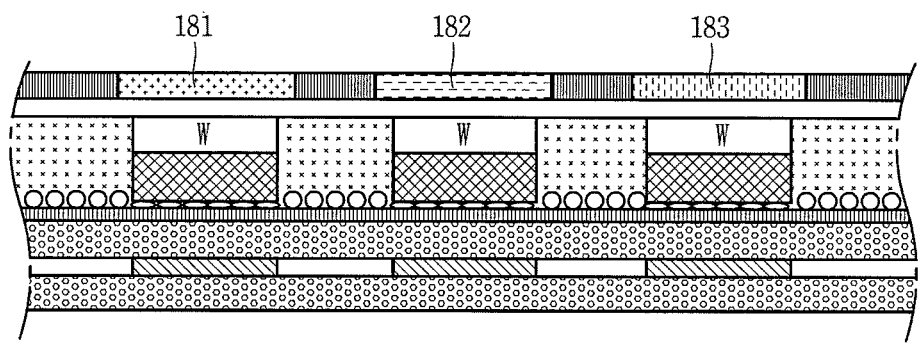

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel.

Furthermore, a color filter repeated with red, green and blue on the white light emitting device (W) may be used to implement a sub-pixel.

Figure 5C:
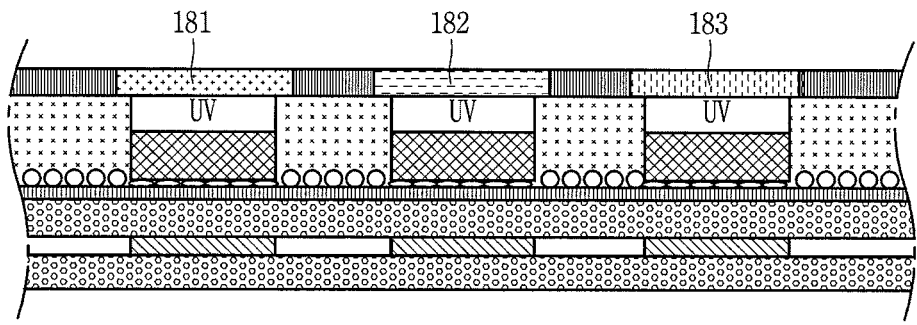

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In an instance of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in the instance of a rectangular pixel in which one side of a sub-pixel is 600 µm in size, and the remaining one side thereof is 300 µm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
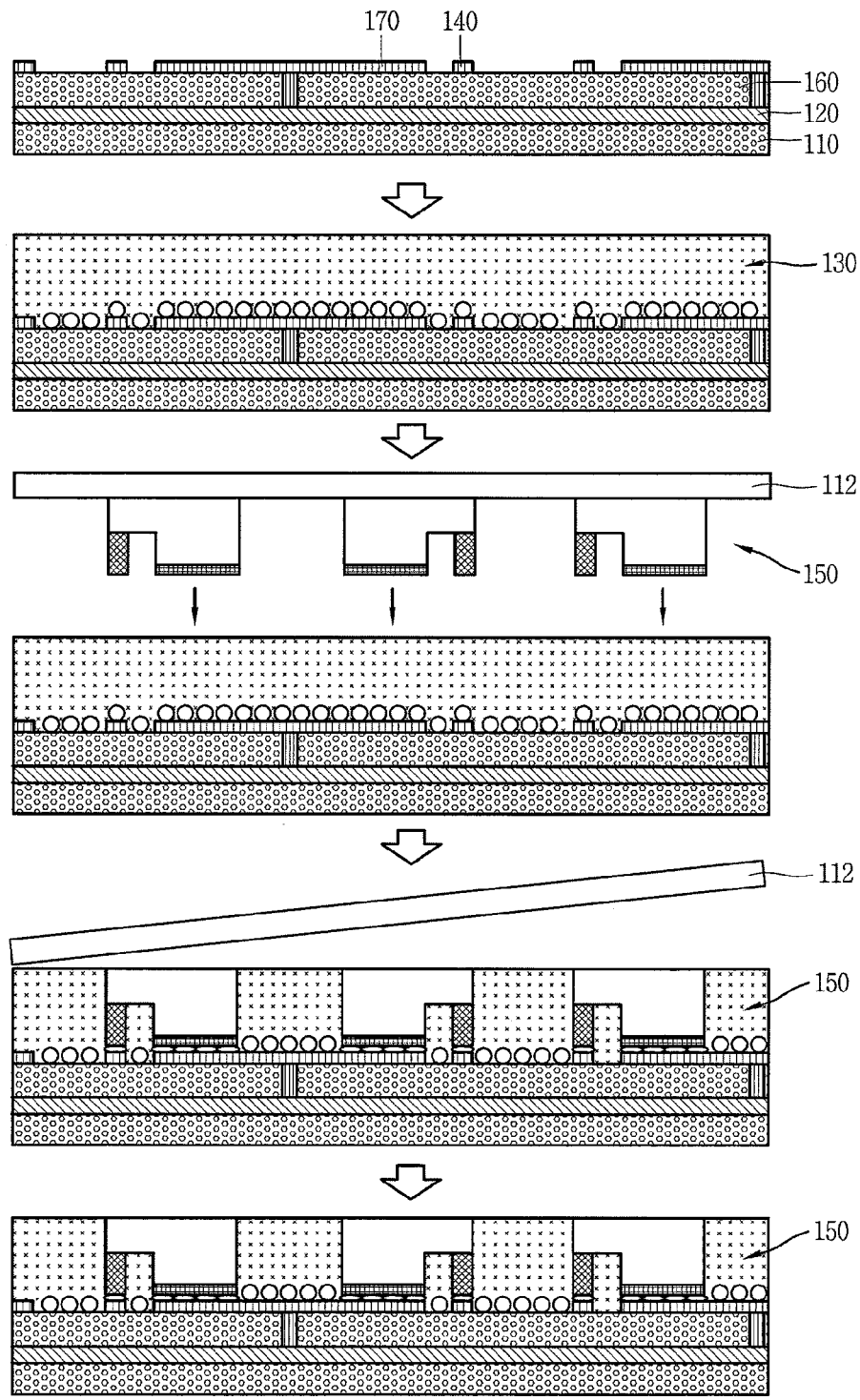
FIG. 6 is cross-sectional views illustrating a method of fabricating a display device using a semiconductor light emitting device according to the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
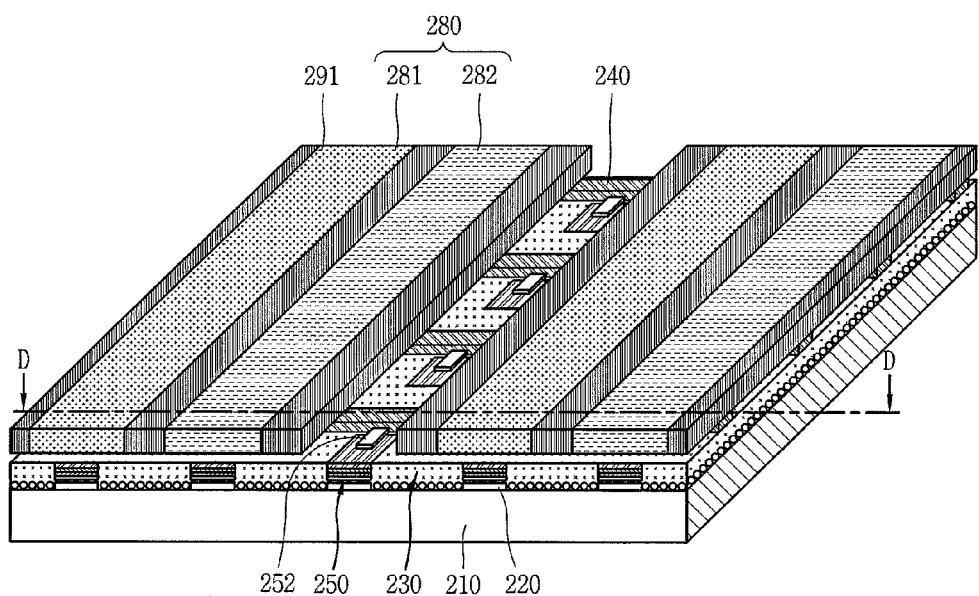
FIG. 7 is a perspective view illustrating a display device using a semiconductor light emitting device according to another embodiment of the invention.
Figure 8:
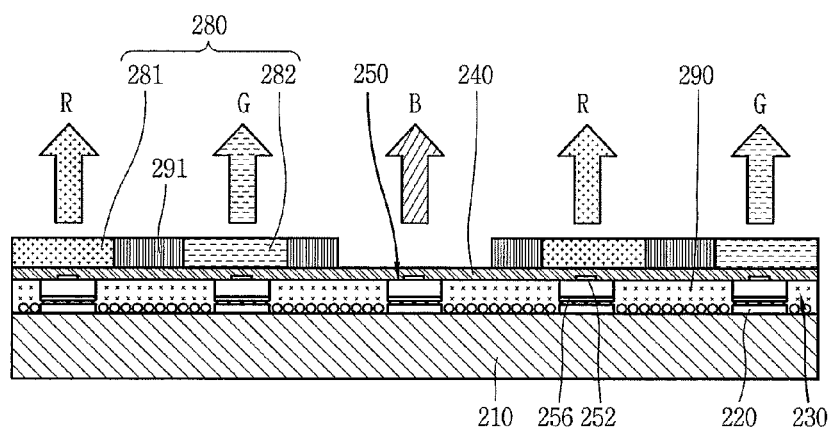
FIG. 8 is a cross-sectional view taken along line D-D in FIG. 7.
Figure 9:
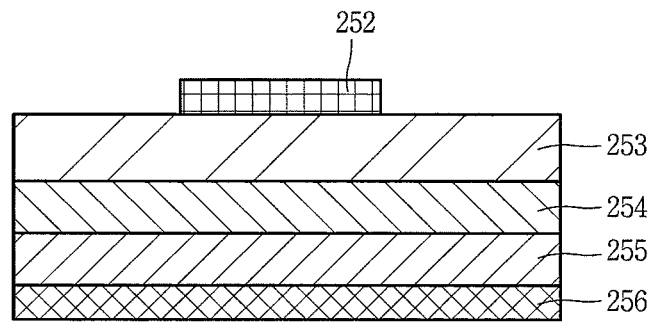
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line D-D in FIG. 7, and FIG. 9 is a conceptual view illustrating a vertical type semiconductor light emitting device in FIG. 8.

According to the drawings, the display device may be a display device using a passive matrix (PM) type of vertical semiconductor light emitting device, but in other embodiments, an active matrix (AP) type of vertical semiconductor light emitting device may be used.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In the instance of a rectangular shaped element, the size thereof may be less than 20×80 µm.

The semiconductor light emitting device 250 may be of a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiments of the invention may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

When a flip chip type is applied to a display device using a semiconductor light emitting device according to the embodiment of the invention as described above, the semiconductor light emitting device is electrically connected to a first electrode and a second electrode on the same plane using an electrode hole 171 (see FIG. 3A) passing through an insulating layer 160. Due to such as wiring connection structure, one electrode hole should be provided for at least one pair of semiconductor light emitting devices, thereby causing a problem in which the implementation of a fine pitch is difficult in the display device. According to the embodiments of the invention, there is proposed a new type semiconductor light emitting device and wiring connection structure capable of solving such a problem. Hereinafter, a display device to which such a new type semiconductor light emitting device and wiring connection structure is applied will be described in more detail.

Figure 10A:
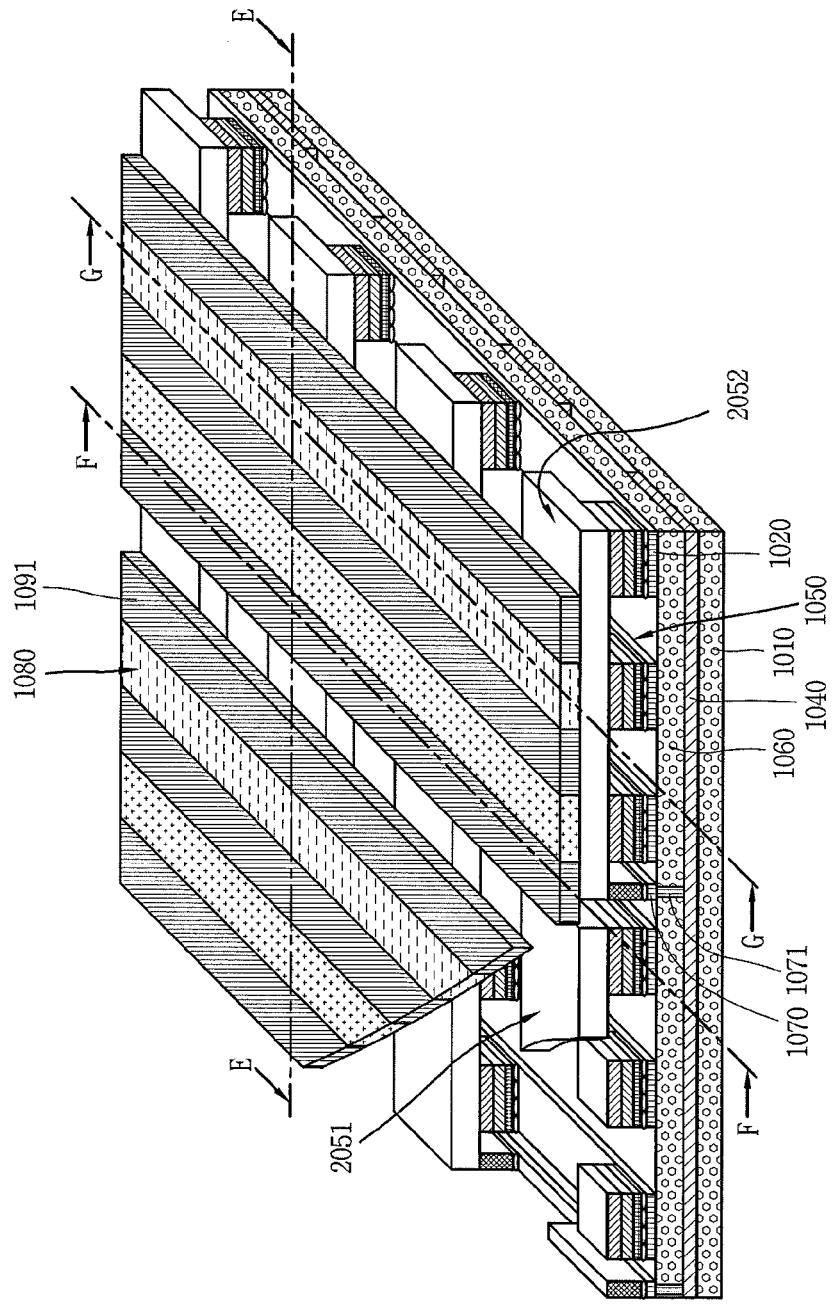
FIGS. 10A and 10B are a partially enlarged view and a partially exploded view illustrating a display device to which a semiconductor light emitting device with a new structure is applied.
Figure 10B:
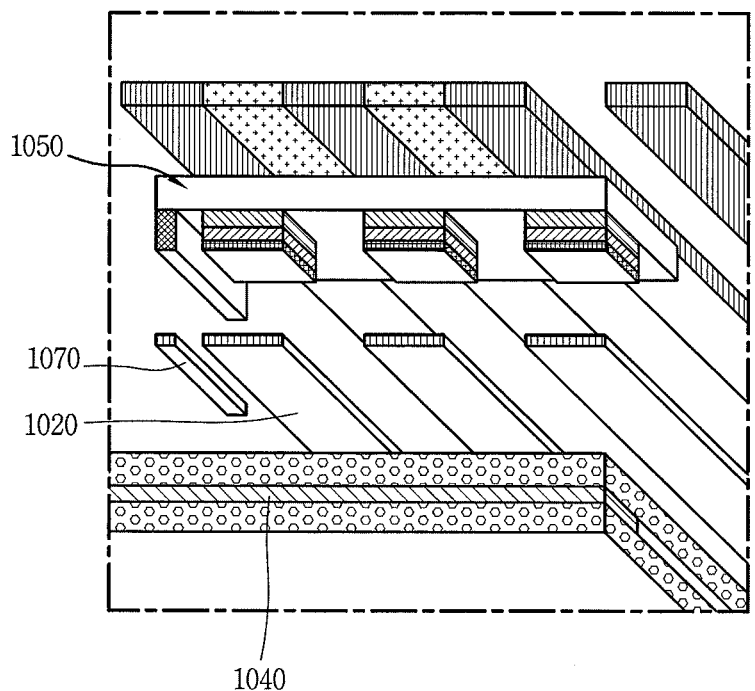
Figure 11A:
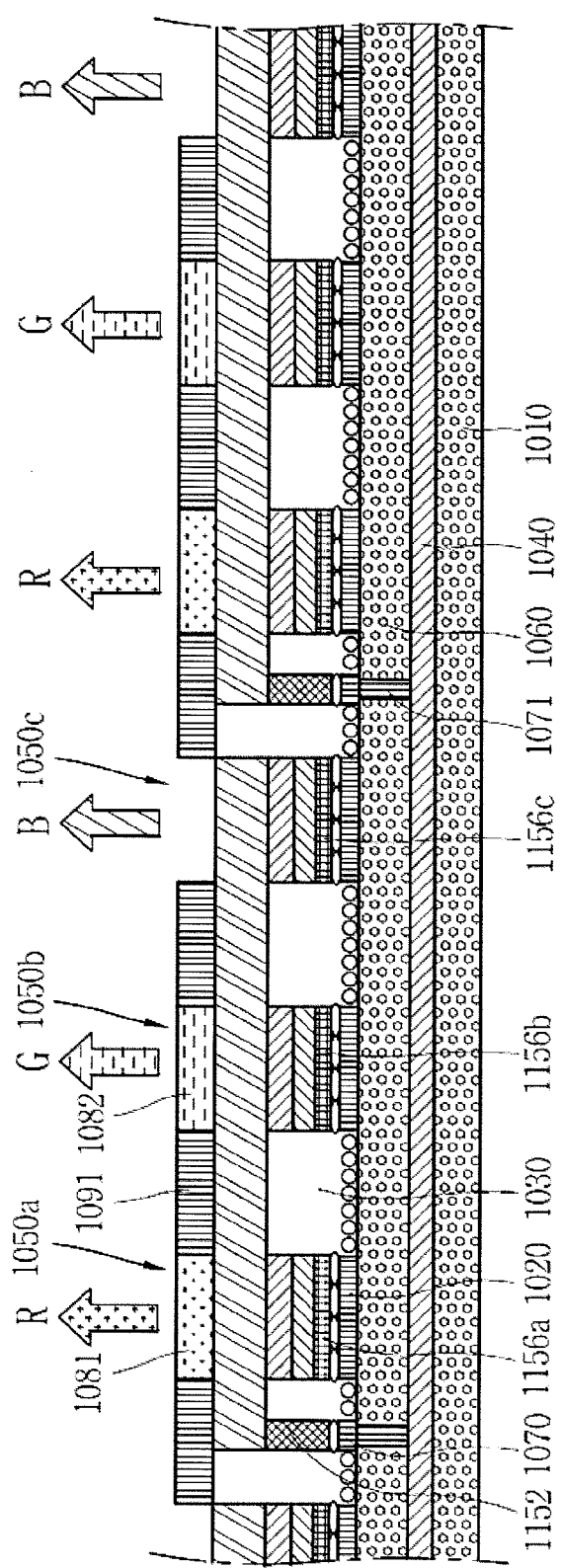
FIG. 11A is a cross-sectional view taken along line E-E in FIG. 10.
Figure 11B:
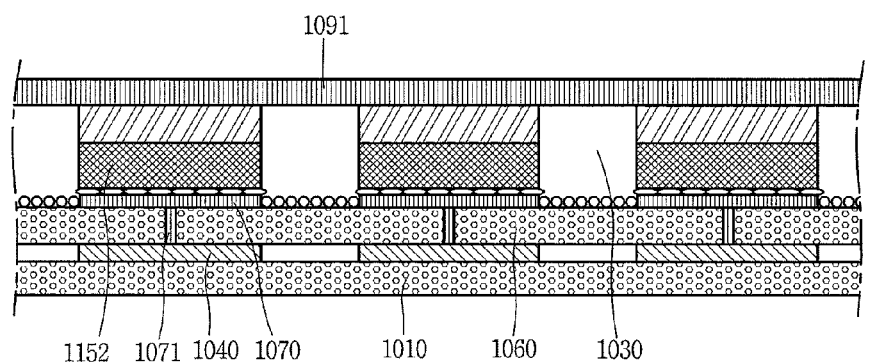
FIG. 11B is a cross-sectional view taken along line F-F in FIG. 11.
Figure 11C:
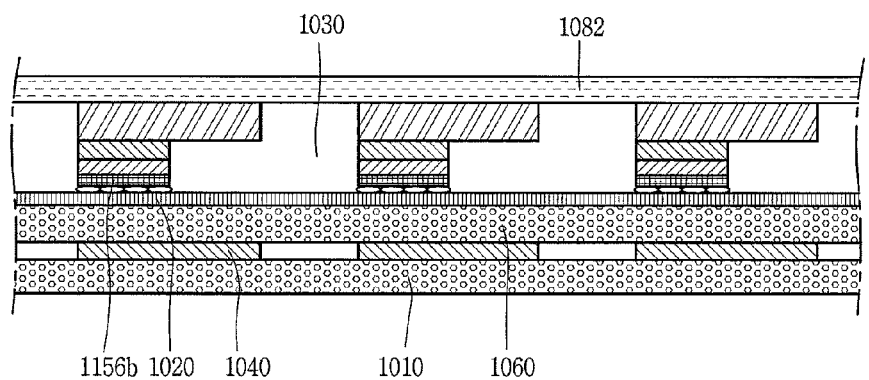
FIG. 11C is a cross-sectional view taken along line G-G in FIG. 11.
Figure 12:
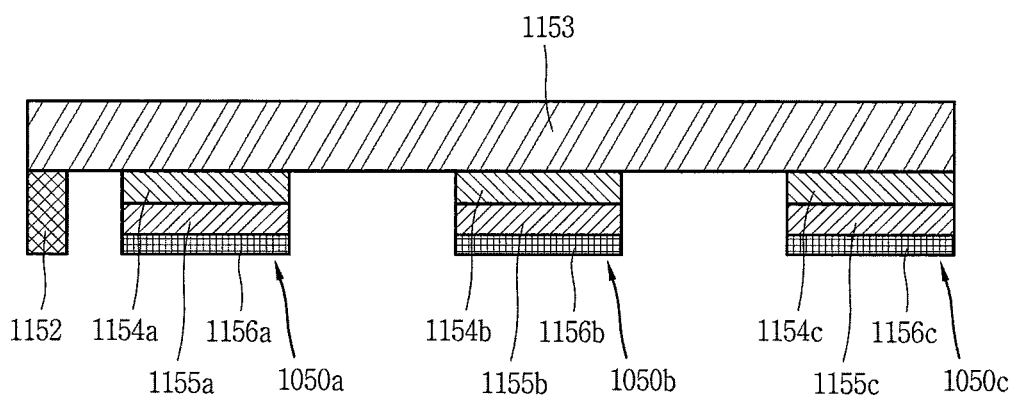
FIG. 12 is a conceptual view illustrating a semiconductor light emitting device in FIG. 11A.

FIGS. 10A and 10B are a partially enlarged view and a partially exploded view illustrating a display device to which a semiconductor light emitting device with a new structure is applied, and FIG. 11A is a cross-sectional view taken along line E-E in FIG. 10, and FIG. 11B is a cross-sectional view taken along line F-F in FIG. 11, and FIG. 11C is a cross-sectional view taken along line G-G in FIG. 11, and FIG. 12 is a conceptual view illustrating a semiconductor light emitting device in FIG. 11A.

According to the drawings in FIGS. 10A, 10B, 11A, 11B and 11C, there is illustrated a display device 100 using a passive matrix (PM) type semiconductor light emitting device as a display device 1000 using a semiconductor light emitting device. However, the following illustration may be also applicable to an active matrix (AM) type semiconductor light emitting device.

The display device 1000 may include a substrate 1010, a first electrode 1020, a conductive adhesive layer 1030, a second electrode 1040, and a plurality of semiconductor light emitting devices 1050. In this instance, the first electrode 1020 and second electrode 1040 may include a plurality of electrode lines, respectively.

The substrate 1010 as a wiring substrate may include polyimide (PI) to implement a flexible display device. In addition, any one may be used if it is an insulating and flexible material.

According to the drawing, an insulating layer 1060 may be disposed on the substrate 1010, and an auxiliary electrode 1070 may be placed on the insulating layer 1060. In this instance, a configuration in which the insulating layer 1060 is deposited on the substrate 1010 may be a single wiring substrate. More specifically, the insulating layer 1060 may be incorporated into the substrate 1010 with an insulating and flexible material such as polyimide (PI), PET, PEN or the like to form a single wiring substrate.

According to the drawing, the first electrode 1020 may be located on the insulating layer 1060, and formed with an electrode having a bar elongated in one direction. The first electrode 1020 may be formed to perform the role of a data electrode. In this instance, the second electrode 1040 is located on the substrate 1010, and disposed in a direction crossed with a length direction of the first electrode 1020 as an elongated bar shaped electrode. The second electrode 1040 may be formed to perform the role of a gate electrode (scan electrode). However, the embodiments of the invention may not be necessarily limited to this, and the first electrode 1020 may be a scan electrode, and the second electrode 1040 may be a data electrode.

The auxiliary electrode 1070 as an electrode for electrically connecting the second electrode 1040 to the semiconductor light emitting device 1050 is placed on the insulating layer 1060, and disposed to correspond to the location of the second electrode 1040. For example, the auxiliary electrode 1070 has a dot shape, and may be electrically connected to the second electrode 1040 by means of an electrode hole 1071 passing through the insulating layer 1060. The electrode hole 1071 may be formed by filling a conductive material in a via hole.

Referring to the drawings, the conductive adhesive layer 1030 may be formed on one surface of the insulating layer 1060, but the embodiments of the invention may not be necessarily limited to this. For example, it may be possible to also have a structure in which a layer performing a specific function is formed between the insulating layer 1060 and conductive adhesive layer 1030, or the conductive adhesive layer 1030 is disposed on the substrate 1010 with no insulating layer 1060. The conductive adhesive layer 1030 may perform the role of an insulating layer in the structure in which the conductive adhesive layer 1030 is disposed on the substrate 1010.

Similarly to a display device to which the foregoing flip chip type light emitting device is applied, the conductive adhesive layer 1030 may be an anisotropic conductive film (ACF), an anisotropic conductive paste, a solution containing conductive particles, and the like. However, the present embodiment illustrates an instance where the conductive adhesive layer 1030 is implemented by an anisotropic conductive film.

When an anisotropic conductive film is located on the substrate 1010, and then heat and pressure are applied to connect the semiconductor light emitting device 1050 thereto, the semiconductor light emitting device 1050 is electrically connected to the first electrode 1020 and auxiliary electrode 1070. At this time, the semiconductor light emitting device 1050 may be preferably disposed at a position facing the first electrode 1020 and auxiliary electrode 1070.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 1030 implements a mechanical coupling as well as an electrical coupling between the semiconductor light emitting device 1050 and the first electrode 1020.

According to the foregoing structure, the semiconductor light emitting device 1050 is coupled to the conductive adhesive layer 1030, and electrically connected to the first electrode 1020 and second electrode 1040 formed on different surfaces.

In order to implement a fine pitch in the foregoing structure, according to the embodiment of the invention, the semiconductor light emitting device 1050 forms a sub-pixel portion having a plurality of light emitting portions 1050a, 1050b, 1050c that emit different light (e.g., different color lights). In other words, one semiconductor light emitting device 1050 forms a sub-pixel portion.

As described above, a new type semiconductor light emitting device 1050 forming a sub-pixel portion is electrically connected to the first electrode 1020 and second electrode 1040 to implement a display device with a fine pitch. More specifically, a semiconductor light emitting device having a plurality of first conductive electrodes 1156a, 1156b, 1156c and a single second conductive electrode 1152 is disposed at the sub-pixel portion. Hereinafter, the foregoing structure will be described in more detail.

As illustrated in the drawing, the semiconductor light emitting device 1050 is electrically connected to a plurality of electrode lines provided in the first electrode 1020 and a single auxiliary electrode connected to the second electrode 1040. In this instance, a single electrode line provided in the second electrode 1040 may be connected to the single auxiliary electrode, and due to this, the semiconductor light emitting device 1050 may be electrically connected to a single electrode line provided in the second electrode 1040.

More specifically, the first electrode 1020 has a plurality of first electrode lines, and the second electrode 1040 has a plurality of second electrode lines, and the first electrode lines and second electrode lines are formed in directions crossed with each other.

At least part of the first electrode lines and second electrode lines is electrically connected to the sub-pixel portion. For example, the sub-pixel portion is electrically connected to a plurality of electrode lines of the first electrode lines, and electrically connected to a single electrode line of the second electrode line.

Furthermore, one semiconductor light emitting device 1050 forms a sub-pixel portion, and the sub-pixel portion has first conductive electrodes 1156a, 1156b, 1156c corresponding to the plurality of light emitting portions 1050a, 1050b, 1050c, and a second conductive electrode 1152 which is a common electrode. Furthermore, an electrode hole 1071 is formed on the wiring substrate to electrically connect the second electrode 1040 to the second conductive electrode 1152 on a surface on which the first electrode 1020 is formed. The electrode hole 1071 may be a via hole formed by filling a conductive material therein.

The semiconductor light emitting device 1050 according to the embodiment of the invention is formed to emit light from a plurality of light emitting portions 1050a, 1050b, 1050c, and to this end, connected to a plurality of electrode lines of the first electrode 1020 and a single auxiliary electrode 1070. Accordingly, only one via hole is required for each sub-pixel portion, thereby having an advantage of implementing a fine pitch display. Hereinafter, the structure of a new semiconductor light emitting device will be described in more detail.

Referring to FIG. 12, for example, the semiconductor light emitting device 1050 may include a plurality of first conductive semiconductor layers 1155a, 1155b, 1155c and a plurality of first conductive electrodes 1156a, 1156b, 1156c. The plurality of first conductive electrodes 1156a, 1156b, 1156c may be formed on the plurality of first conductive semiconductor layers, respectively. Furthermore, the first conductive electrodes 1156a, 1156b, 1156c are disposed to be separated from one another at regular intervals. For such an example, the plurality of first conductive semiconductor layers 1155a, 1155b, 1155c may be p-type semiconductor layers, respectively, and the plurality of first conductive electrodes 1156a, 1156b, 1156c may be p-type electrodes, respectively.

According to the drawing, the second conductive semiconductor layer 1153 is overlapped with the plurality of first conductive semiconductor layers 1155a, 1155b, 1155c. For example, the second conductive semiconductor layer 1153 is a single semiconductor layer, and the plurality of first conductive semiconductor layers 1155a, 1155b, 1155c are overlapped with the single semiconductor layer.

A plurality of active layers 1154a, 1154b, 1154c are formed between the second conductive semiconductor layer 1153 and the plurality of first conductive semiconductor layers 1155a, 1155b, 1155c, respectively, and the second conductive electrode 1152 is deposited on the second conductive semiconductor layer 1153. In this instance, the second conductive electrode 1152 may be a single conductive electrode.

In this instance, the active layers 1154a, 1154b, 1154c may be formed between the second conductive semiconductor layer 1153 and the plurality of first conductive semiconductor layers 1155a, 1155b, 1155c, respectively, to sequentially form the plurality of light emitting portions 1050a, 1050b, 1050c along a direction parallel to the single semiconductor layer.

In this instance, the second conductive electrode 1152 and second conductive semiconductor layer 1153 may be an n-type electrode and an n-type semiconductor layer, respectively. However, the embodiments of the invention may not be necessarily limited to this, and may also have an illustration in which the first conductive type is an n-type and the second conductive type is a p-type.

Referring to FIG. 12 along with FIGS. 10A, 10B, 11A, 11B and 11C again, the plurality of light emitting portions 1050a, 1050b, 1050c may include a red output portion 1050a, a green output portion 1050b, and a blue output portion 1050c to form a sub-pixel portion. The red output portion 1050a, green output portion 1050b, and blue output portion 1050c are formed to emit red, green and blue light, respectively.

The red output portion 1050a, green output portion 1050b, and blue output portion 1050c may be all formed on one surface of the second conductive semiconductor layer 1153. On the contrary, a plurality of first conductive semiconductor layers 1155a, 1155b, 1155c may be disposed to correspond to the red output portion 1050a, green output portion 1050b, and blue output portion 1050c, respectively. Accordingly, the plurality of first conductive semiconductor layers 1155a, 1155b, 1155c are all disposed to cover a single second conductive semiconductor layer 1153.

A display device may further include a phosphor layer 1080 formed on one surface of the semiconductor light emitting device 1050 to allow the semiconductor light emitting device 1050 to emit red, green and blue lights. For example, the semiconductor light emitting device 1050 is a blue semiconductor light emitting device that emits blue (B) light, and the phosphor layer 1080 performs a function of converting the blue (B) light into a sub-pixel color. The phosphor layer 1080 may be a red phosphor 1081 or green phosphor 1082 constituting an individual pixel. In other words, a red phosphor 1081 capable of converting blue light into red (R) light may be deposited on the red output portion 1050a at a position for implementing a red sub-pixel, and a green phosphor 1082 capable of converting blue light into green (G) light may be deposited on the green output portion 1050b at a position for implementing a green sub-pixel. Furthermore, only the blue output portion 1050c may be solely used on a portion for implementing a blue sub-pixel. In this instance, the red (R), green (G) and blue (B) sub-pixels may form one pixel. More specifically, one color phosphor may be deposited along each line of the first electrode 1020. Accordingly, red (R), green (G) and blue (B) may be sequentially disposed along the first electrode 1020, thereby implementing a sub-pixel.

On the other hand, a display device may further include a black matrix 1091 disposed between each phosphor to enhance the contrast of the phosphor layer 1080. The black matrix 1091 may be formed in such a manner that a gap is made between phosphor dots, and a black material fills into the gap. Through this, the black matrix 1091 may enhance the contrast between light and shade while at the same time absorbing external light reflection. The black matrix 1091 is located between each phosphor along the first electrode 1020 in a direction on which the phosphor layer 1080 is deposited.

On the other hand, referring to FIGS. 10A and 10B, the sub-pixel portion may be either one of a first sub-pixel portion 2051 and a second sub-pixel portion 2052 which are adjacent to each other. In other words, a plurality of semiconductor light emitting devices with a new structure forming one sub-pixel are provided and arranged in a matrix form.

More specifically, the structure of a semiconductor light emitting device is formed to allow light emitting regions (p-mesa portions) in three sections corresponding to a sub-pixel within one semiconductor light emitting device to be isolated to a second conductive semiconductor layer.

In this instance, the second conductive electrode of the first sub-pixel portion 2051 and the second conductive electrode of the second sub-pixel portion 2052 are sequentially arranged along a direction perpendicular to the line. In other words, the arrangement direction of three first conductive electrodes is formed perpendicular to the arrangement direction of one second conductive electrode. Through this, three first electrode lines of the first electrode 1020 and one second line of the second electrode 1040 are perpendicular to each other, and a signal is supplied to a sub-pixel through the structure provided with one via hole.

According to a display device using a flip chip type semiconductor light emitting device in FIGS. 2 and 3, a p-pad (first conductive electrode) and an n-pad (second conductive electrode) in the semiconductor light emitting device exist on one side surface of the wiring substrate. Accordingly, the connection structure of a p-electrode wire (first electrode) should be provided with a via hole during the wiring design phase. More specifically, the n-pad is connected to a horizontal n-wire electrode and connected to a scan line. The p-pad is connected to a p-wire terminal (auxiliary electrode) and to this end one via hole is provided for each pixel (for each semiconductor light emitting device) on the wiring substrate. It is connected to the p-wire electrode vertically arranged on an opposite surface to the wiring substrate through the via hole and connected to the data line. For another example, as illustrated in FIG. 3, two LED chips are connected to one p-electrode terminal with a via-hole structure and thus two LED p-pads are formed to share one p-wire electrode.

When one via hole is provided for each pixel, a width of the p-wire terminal should be implemented to be narrower to the level of about 40-50 μm. Furthermore, a lot of process time and cost are required as the number of via holes increases. According to a semiconductor light emitting device with a new structure as described above, the number of via holes decreases, thereby solving the foregoing problem. Moreover, it may be possible to implement a fine pitch flexible display device.

In the above, an instance where a display device includes a blue semiconductor light emitting device that emits blue (B) light has been described, but the embodiments of the invention may not be necessarily limited to this, and another structure for implementing red, green and blue colors may be also applicable thereto.

Figure 13A:
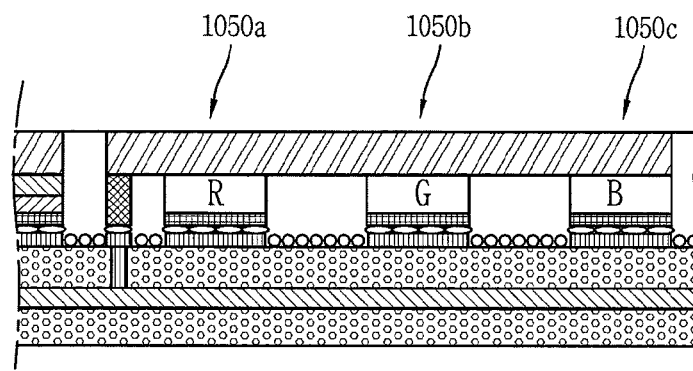
FIGS. 13A through 13C are conceptual views illustrating various forms for implementing color associated with a semiconductor light emitting device with a new structure.
Figure 13B:
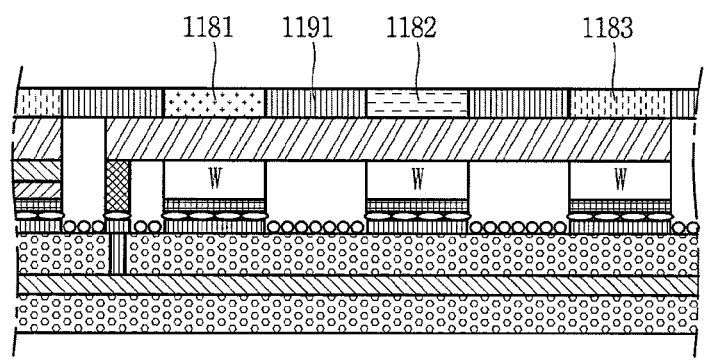
Figure 13C:
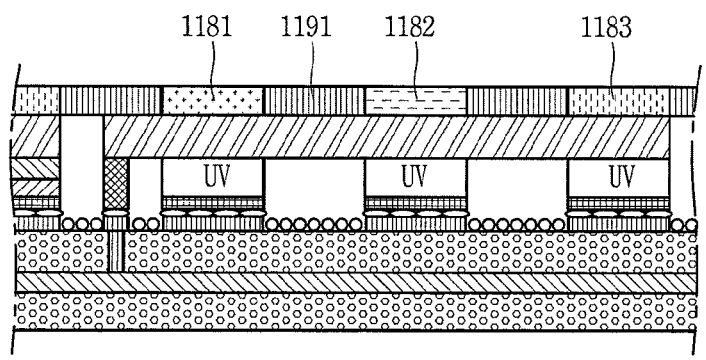

FIGS. 13A through 13C are conceptual views illustrating various forms for implementing color associated with a semiconductor light emitting device with a new structure.

Referring to FIG. 13A, the red output portion 1050a, green output portion 1050b, and blue output portion 1050c may be implemented as a high power light emitting device that emits various light in addition to blue in which gallium nitride (GaN) is mostly used, and indium (In) and/or aluminum (Al) are additionally used.

In this instance, the red output portion 1050a, green output portion 1050b, and blue output portion 1050c may have the structure of red, green and blue semiconductor light emitting devices, respectively. For instance, the second conductive semiconductor layer and second conductive electrode are shared by the red, green and blue semiconductor light emitting devices (R, G, B), and through this, red, green and blue sub-pixels form one pixel in one semiconductor light emitting device.

In this manner, when the red output portion 1050a, green output portion 1050b, and blue output portion 1050c independently implement R, G and B, an additional phosphor layer may not be provided therein. In this manner, a semiconductor light emitting device having the red output portion 1050a, green output portion 1050b, and blue output portion 1050c that emit red, green and blue light with no phosphor layer may be a semiconductor light emitting device with a new structure described with reference to FIGS. 10A, 10B, 11A, 11B and 11C, respectively. The description of the above structure will be substituted by the earlier description.

On the other hand, even in this instance, for contrast enhancement and external reflection, a display device may further include a black matrix disposed between a plurality of columns configured with the red output portion 1050a, green output portion 1050b, and blue output portion 1050c. The black matrix may be disposed to be separated from each other in a horizontal direction.

For another example, referring to FIG. 13B, the semiconductor light emitting device may include white output portions (W) provided with a yellow phosphor layer. In this instance, the white output portion (W) has a structure that emits white light, and a phosphor layer may be formed on an upper surface of the white output portion (W). Furthermore, in order to accomplish a sub-pixel, a red phosphor layer 1081, a green phosphor layer 1082 and a blue phosphor layer 1083 may be provided on the white output portion (W).

Furthermore, the sub-pixel may be carried out using a color filter in which red, green and blue are repeated on the white output portion (W). Even in such a structure, similarly to the foregoing description, each of the white output portions (Ws) may include a plurality of first conductive electrodes and first conductive semiconductor layers, and may be formed on a single second conductive semiconductor layer. In this manner, a semiconductor light emitting device having white output portions (W) may implement a semiconductor light emitting device with a new structure described with reference to FIGS. 10A, 10B, 11A, 11B and 11C, respectively. The description of the foregoing structure will be substituted by the earlier description.

On the other hand, even in this instance, a display unit may further include a black matrix 1091 disposed between a plurality of columns configured with phosphors for contrast and external reflection enhancement. The black matrix 1091 may be disposed between the red phosphor layer 1081, green phosphor layer 1082 and blue phosphor layer 1083.

For still another example, referring to FIG. 13C, it may have a structure in which the red phosphor layer 1081, green phosphor layer 1082 and blue phosphor layer 1083 are provided on the ultraviolet output portion (UV) that emits ultraviolet rays. In this manner, the semiconductor light emitting device may be used for the entire region including visible light as well as ultraviolet (UV), and may be extended to the form of a semiconductor light emitting device in which ultraviolet (UV) can be used as an excitation source of the upper phosphor.

In this manner, the semiconductor light emitting device having an ultraviolet output portion (UV) may implement a semiconductor light emitting device with a new structure described with reference to FIGS. 10A, 10B, 11A, 11B and 11C, respectively. The description of the foregoing structure will be substituted by the earlier description.

On the other hand, even in this instance, the display device may further include a black matrix 1091 disposed between a plurality of columns configured with phosphors for contrast enhancement and external reflection. The black matrix 1091 may be disposed between the red phosphor layer 1081, green phosphor layer 1082, and blue phosphor layer 1083.

Figure 14A:
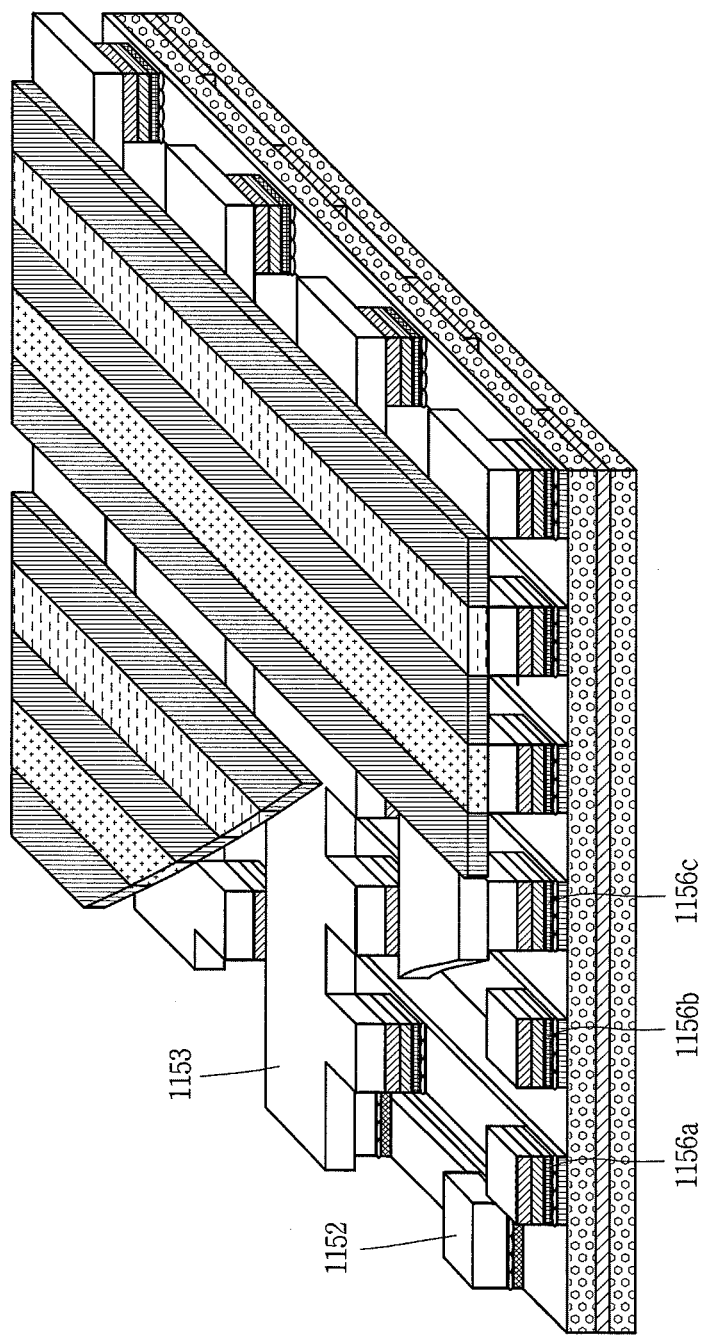
FIGS. 14A and 14B are partially enlarged views illustrating a display device to which a different type semiconductor light emitting device is applied.
Figure 14B:
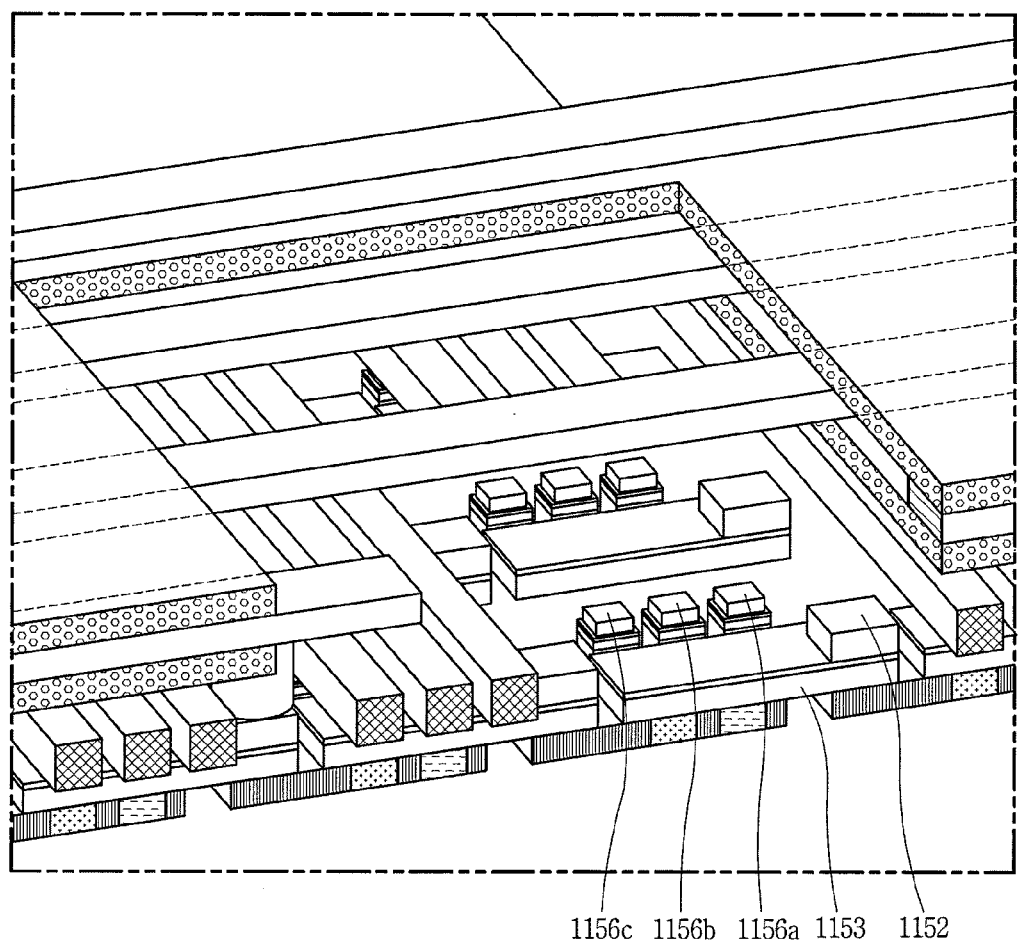

The foregoing semiconductor light emitting device may be modified into another form on a plane. FIGS. 14A and 14B are partially enlarged views illustrating a display device to which a different type semiconductor light emitting device is applied. Hereinafter, unless otherwise stated, according to the structure of the embodiments of the invention, the content described with reference to FIGS. 10A, 10B, 11A, 11B and 11C will be applicable to a display device to which a new type semiconductor light emitting device is applied.

According to the drawing, a plurality of first conductive electrodes 1156a, 1156b, 1156c are disposed to be separated from each other at regular intervals, and a separate space is formed between them. To this end, grooves corresponding to the separate space are created on the second conductive semiconductor layer 1153.

Furthermore, the plurality of first conductive electrodes 1156a, 1156b, 1156c are arranged along a line. In this instance, the line denotes a virtual line, and the second conductive electrode 1152 is disposed to get out of the line (or is offset of the line). Through this, the second conductive electrode 1152 may be offset (or not aligned) on a virtual line connecting the light emitting regions.

Figure 15A:
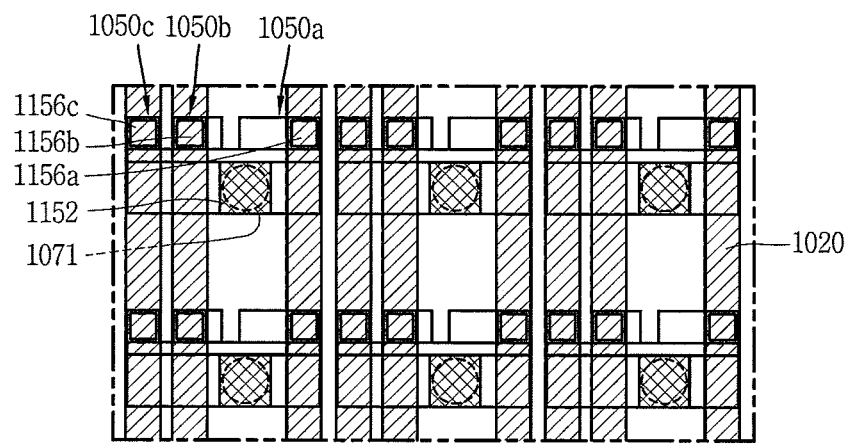
FIGS. 15A through 15C are partially enlarged views illustrating a display device to which a semiconductor light emitting device with a new structure is applied according to another embodiment of the invention.
Figure 15B:
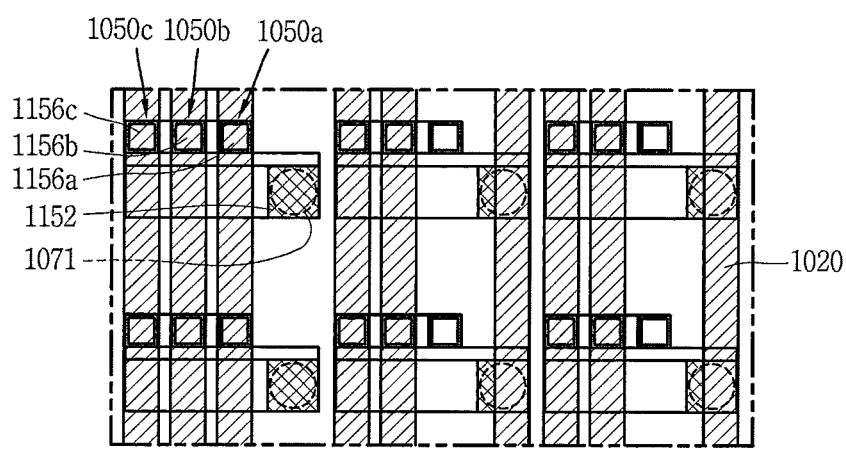
Figure 15C:
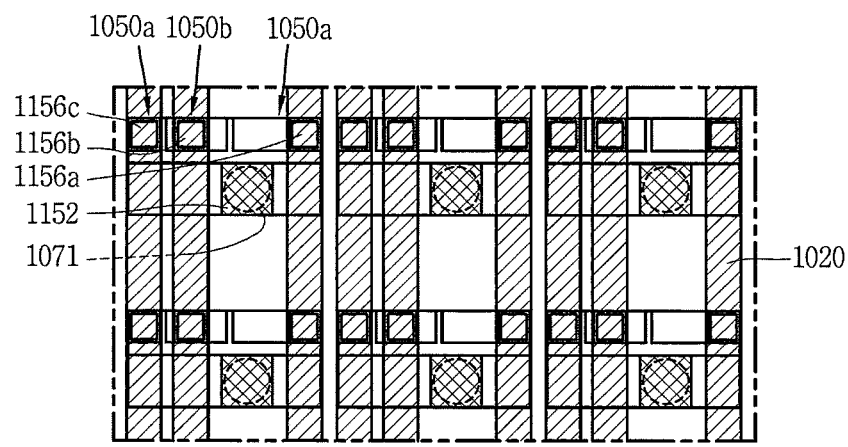

FIGS. 15A through 15C are partially enlarged views illustrating a display device to which a semiconductor light emitting device with a new structure is applied according to another embodiment of the invention. Hereinafter, unless otherwise stated, according to the structure of the embodiments of the invention, the content described with reference to FIGS. 10A, 10B, 11A, 11B and 11C will be applicable to a display device to which a new type semiconductor light emitting device is applied.

Referring to FIG. 15A, a semiconductor light emitting device is formed to have different light emitting areas on the red output portion 1050a, green output portion 1050b, and blue output portion 1050c. More specifically, the first conductive semiconductor layers on each of the output portions 1050a, 1050b, 1050c are formed to have different areas from one another, and thus the active layers on each of the output portions 1050a, 1050b, 1050c are formed to have different areas from one another. For example, the red output portion 1050a, green output portion 1050b, and blue output portion 1050c may be formed such that their area increases in the order of being close to the electrode hole 1071.

Due to such a structure, the light emitting area may be sufficiently increased while having the same resolution (horizontal direction), and the location of a first conductive electrode is designed to be biased to any one side of the light emitting region, thereby having an effect of increasing the light emitting efficiency of a display device.

Furthermore, in this instance, the electrode hole 1071 and second conductive electrode 1152 may be formed between any one pair of the red output portion 1050a, green output portion 1050b, and blue output portion 1050c. However, the embodiments of the invention may not be necessarily limited to this, and the electrode hole 1071 and second conductive electrode 1152 may be biased at any one light emitting region and thus located at an edge of the semiconductor light emitting device.

Furthermore, even in this instance, a plurality of first conductive electrodes 1156a, 1156b, 1156c are separated from one another in the semiconductor light emitting device, but a second conductive electrode 1152 is shared. The plurality of first conductive electrodes may be formed to have the same area. However, the embodiments of the invention may not be necessarily limited to this, and the plurality of first conductive electrodes may be formed to have different areas similarly to the first conductive semiconductor layers.

Referring to FIGS. 15B and 15C, a semiconductor light emitting device may be formed such that a separate space does not exist between the red output portion 1050a, green output portion 1050b, and blue output portion 1050c. When the output portions 1050a, 1050b, 1050c have the same light emitting area (see FIG. 15B) or have different areas (see FIG. 15C), each of the output portions 1050a, 1050b, 1050c is connected to an adjoining output portion not to have a separate space between the output portions 1050a, 1050b, 1050c. In other words, though the light emitting regions of the semiconductor light emitting device are separated from one another, one second conductive electrode is shared by three first conductive electrodes while not separated up to the second conductive semiconductor layer. In other words, only the actual light-emitting portion (p-mesa) is etched and separated, and through this, the etching width can be managed to be smaller than when being etched up to the second conductive semiconductor layer. Consequently, according to the structure of the embodiments of the invention, it may be possible to further increase the light emitting region, thereby enhancing the light emitting efficiency.

In the embodiments shown in FIGS. 15A-15B, within a sub-pixel portion, the second conductive electrode 1152 may be disposed at an intermediate position between the plurality of light emitting portions 1050a, 1050b, 1050C or the plurality of first electrodes 1120, or may be disposed to one side of all of the plurality of light emitting portions 1050a, 1050b, 1050C or the plurality of first electrodes 1120, or both (see FIG. 15B). The plurality of light emitting portions 1050a, 1050b, 1050C within the same sub-pixel portion may be aligned or offset, and the plurality of light emitting portions 1050a, 1050b, 1050C within different sub-pixel portions may be aligned, offset, or both.

Figure 16A:
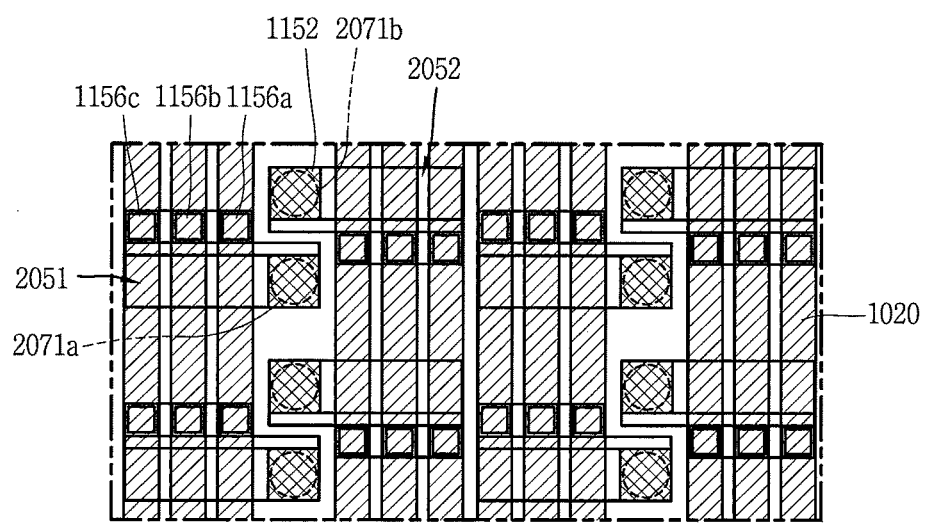
FIGS. 16A through 16E are partially enlarged views illustrating a display device to which a semiconductor light emitting device with a new structure is applied according to still another embodiment of the invention.
Figure 16B:
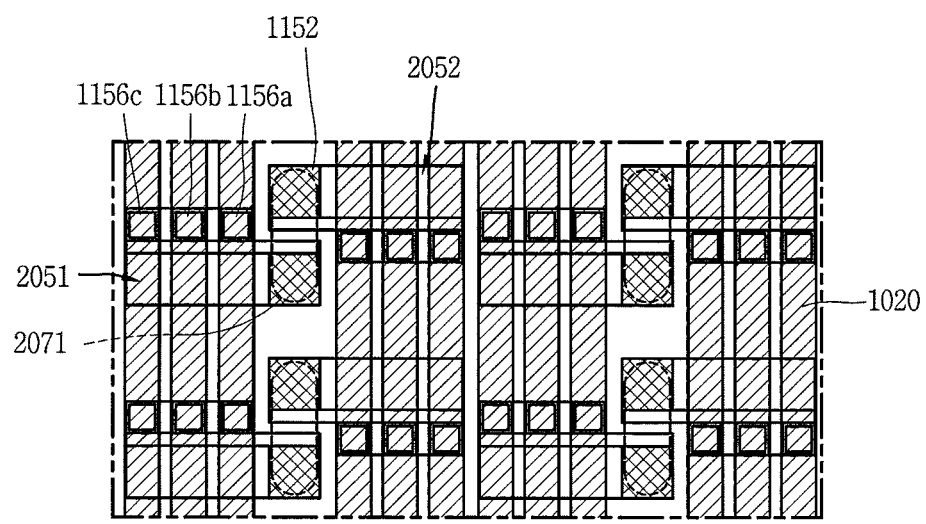
Figure 16C:
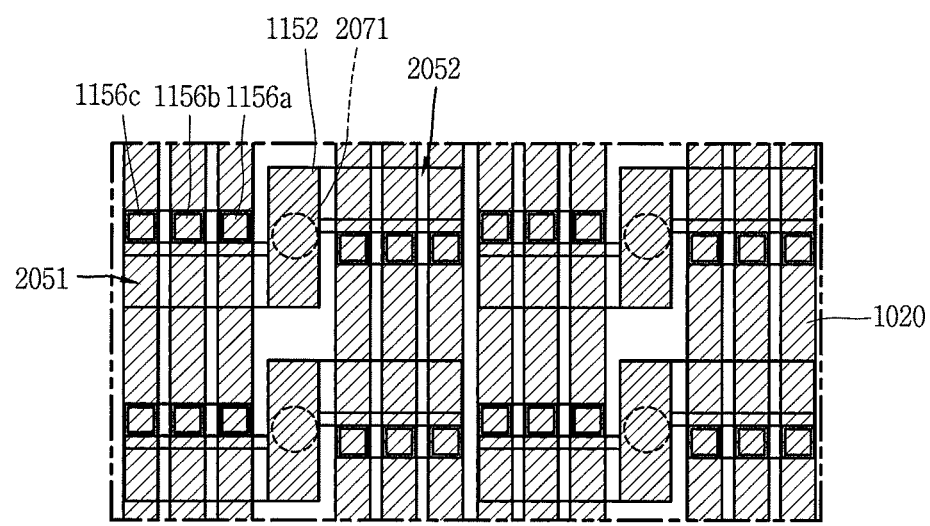

FIGS. 16A through 16C are partially enlarged views illustrating a display device to which a semiconductor light emitting device with a new structure is applied according to still another embodiment of the invention. Hereinafter, unless otherwise stated, according to the structure of the embodiments of the invention, the content described with reference to FIGS. 10A, 10B, 11A, 11B and 11C will be applicable to a display device to which a new type semiconductor light emitting device is applied.

First, referring to FIG. 16A, sub-pixel portions formed by a single semiconductor light emitting device is arranged in a matrix form. In this instance, the arrangement of semiconductor light emitting devices may be disposed in such a manner that the first sub-pixel portion 2051 and second sub-pixel portion 2052 are used as a pair, and the pair is repeated along directions perpendicular to each other.

For such an example, for a pair of sub-pixel portions, the second conductive electrodes of two semiconductor light emitting devices are disposed to be adjacent to each other. For example, the first sub-pixel portion 2051 and second sub-pixel portion 2052 are disposed in a vertical and horizontal symmetry. Through this, the arrangement of each light emitting region of the first sub-pixel portion 2051 and second sub-pixel portion 2052 are opposite to each other at an adjoining sub-pixel portion, and the second conductive electrodes are arranged in a column along a direction in which the first electrode is formed. Accordingly, the electrode holes 2071a, 2071b of the first sub-pixel portion 2051 and second sub-pixel portion 2052 are arranged in a column. In this instance, one via hole may be required for each two sub-pixel portions in a horizontal direction, thereby increasing resolution.

According to the embodiments of the invention, one electrode hole is formed for each sub-pixel portion, but another example may be also available. More specifically, as illustrated in FIG. 16B, it is also available a structure in which one electrode hole is formed for each pair of sub-pixel portions. For example, the electrode hole 2071 may be connected from the first sub-pixel portion 2051 to the second sub-pixel portion 2052 to cover each of the second conductive electrode of the first sub-pixel portion 2051 and the second conductive electrodes of the second sub-pixel portion 2052. In this instance, the electrode hole may be formed in an elongated shape in one direction to cover the second conductive electrodes of the first sub-pixel portion 2051 and second sub-pixel portion 2052.

In other words, two semiconductor light emitting devices are disposed to be adjacent to each of the second conductive electrodes, and a second electrode electrically connected to one electrode hole (or auxiliary electrode) is connected to two second conductive electrodes.

Figure 16D:
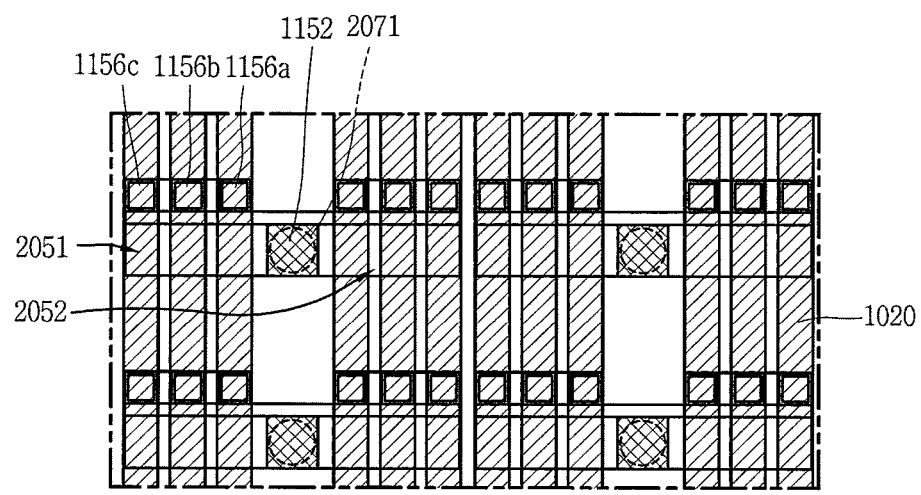

For another example, referring to FIGS. 16C and 16D, it is also available a structure in which a pair of sub-pixel portions are connected to each other. For example, two semiconductor light emitting devices are connected to one second conductive electrode. In this instance, one electrode hole (or auxiliary electrode) may be formed for each pair of sub-pixel portions.

The first sub-pixel portion and second sub-pixel portion are formed to share a single second conductive electrode, and the electrode hole is formed to correspond to the single second conductive electrode.

More specifically, FIG. 16C illustrates a structure in which two semiconductor light emitting devices are fabricated as one unit, and then one via hole wire terminal (a combination of an electrode hole and a second conductive electrode) is connected to one second conductive electrode, and FIG. 16D illustrates a structure in which first conductive electrodes are arranged in parallel in a horizontal direction, and a via hole wire terminal is connected between two sub-pixel portions.

In this manner, when two sub-pixel portions are configured with one semiconductor light emitting device, and a second conductive electrode is connected to a second electrode line through one electrode hole, one wire width for each two pixels can be additionally secured.

Furthermore, the first sub-pixel portion and second sub-pixel portion are formed in a horizontal symmetry or vertical and horizontal symmetry around the single second conductive electrode. The light emitting regions in the adjoining sub-pixel portions may be disposed in opposite directions to each other in the instance of the vertical and horizontal symmetry, but arranged in parallel to each other in the instance of the horizontal symmetry.

Figure 16E:
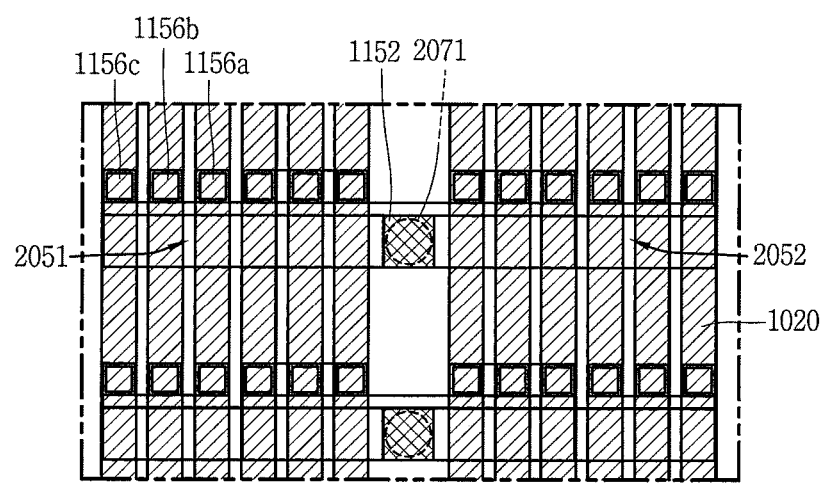

For another example, referring to FIG. 16E, a semiconductor light emitting device may include four sub-pixel portions, and one second conductive electrode may be provided for the four sub-pixel portions. In this instance, first conductive electrodes which are light emitting regions may be arranged in parallel to each other within the semiconductor light emitting device.

In this instance, two sub-pixel portions are disposed at the left and right sides of one second conductive electrode, and accordingly, one semiconductor light emitting device may include twelve light emitting regions and one first conductive electrode to take charge of total twelve sub-pixels. A wire electrode is formed with one via hole wire electrode and twelve stripe type wire electrode (first electrode line) at the left and right sides thereof. In this manner, when a via hole is connected to a second conductive electrode, it may be possible to connect one via hole wire terminal for four or more sub-pixel portions.

In the embodiments shown in FIGS. 16A-16E, the plurality of light emitting portions 1050a, 1050b, 1050C within the same sub-pixel portion may be aligned or offset, and the plurality of light emitting portions 1050a, 1050b, 1050C within different sub-pixel portions may be aligned, offset, or both. Further, the second conductive electrode 1152 and the second conductive semiconductor layer 1153 of the different sub-pixel portions may be aligned, offset, or both.

In view of FIGS. 12-16E, a sub-pixel portion includes a plurality of light emitting portions 1050a, 1050b, 1050C, respectively connected to a plurality of first conductive electrodes 1156a, 1156b, 1156c via a plurality of first conductive semiconductor layer 1155a, 1155b, 1155c. The plurality of light emitting portions 1050a, 1050b, 1050C are also commonly connected to a second conductive electrode 1152 via a second conductive semiconductor layer 1153. In turn, the plurality of first conductive electrodes 1156a, 1156b, 1156c are connected to a plurality of first electrodes 1120, and the second conductive electrode 1152 is connected to a second electrode 1040. In embodiments of the invention, the plurality of first electrodes 1120 cross the second conductive semiconductor layer 1153, and the second conductive electrode 1152 extends in a direction perpendicular to extending directions of the plurality of first electrodes 1120 and the second conductive semiconductor layer 1153, respectively.

According to the foregoing embodiments, a distance varies from a single second conductive electrode to a plurality of first conductive electrodes, respectively, which are sub-pixels. Due to this, a difference occurs between wire resistance. In order to compensate the difference between wire resistances, according to the embodiments, a data voltage applied to each sub-pixel of the data line (first electrode line) varies. In other words, a larger wire resistance is applied to a sub-pixel which is located farther from the second conductive electrode, and thus the data voltage of the relevant sub-pixel is controlled to be higher.

Figure 17A:
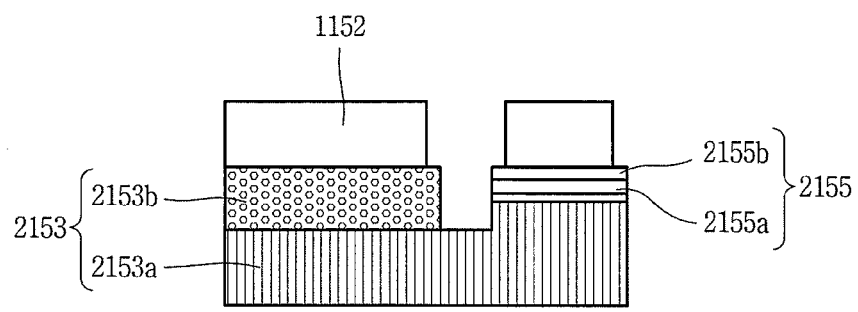
FIGS. 17A through 17C are partially enlarged views illustrating a display device to which a semiconductor light emitting device with a new structure is applied according to yet still another embodiment of the invention.
Figure 17B:
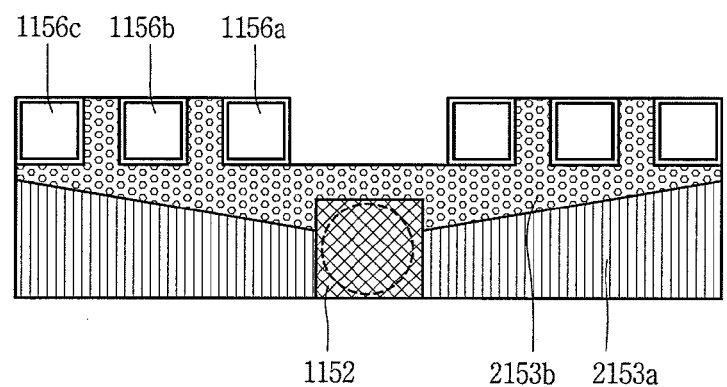
Figure 17C:
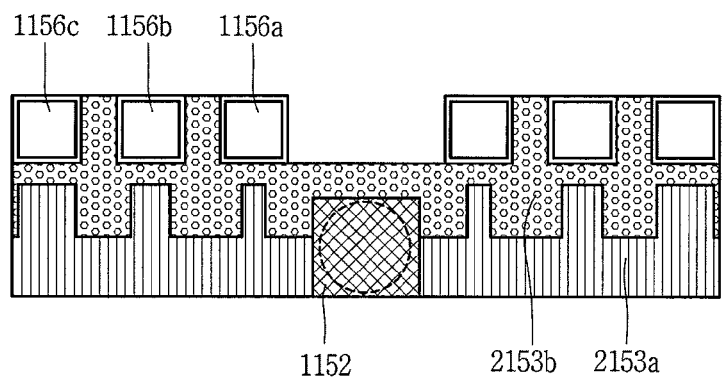

For another solution, also available is a change of the structure of a semiconductor light emitting device. FIGS. 17A through 17C are partially enlarged views illustrating a display device to which a semiconductor light emitting device with a new structure is applied according to yet still another embodiment of the invention. Hereinafter, unless otherwise stated, according to the structure of the embodiments of the invention, the content described with reference to FIGS. 10A, 10B, 11A, 11B and 11C will be applicable to a display device to which a new type semiconductor light emitting device is applied.

Referring to the drawings, a first conductive semiconductor layer 2155 may include a p-type semiconductor layer 2155a, and a p-type contact layer 2155b (p-contact layer), and a second conductive semiconductor layer 2153 may include a p-type semiconductor layer 2153a, and an n-type contact layer 2153b (n-contact layer). In this instance, the contact layer may be an ohmic contact layer for connecting an electrode to a semiconductor layer. In this instance, at least one of a thickness of the n-type contact layer 2153b, a width of the n-type contact layer 2153b, a distance between the n-type contact layer 2153b and a plurality of first conductive electrodes 1156a, 1156b, 1156c may be formed in a different manner on a plurality of light emitting portions.

Referring to FIG. 17A, the width or deposition thickness of the n-type contact layer 2153b may be increased. When the sub-pixel portion is fabricated in a square shape, the width of the n-type contact layer 2153b may increase the n-type contact layer 2153b required for one semiconductor light emitting device.

The deposition thickness of the n-type contact layer may be increased as thick as the height of the p-type contact layer in a p-mesa. In this instance, the first conductive electrode and second conductive electrode may be deposited with the same thickness.

Referring to FIGS. 17B and 17C, in order to reduce a difference between wire resistances, the deposition is carried out in such a manner that a smaller wire resistance is applied to the first conductive electrode 1156c which is located far from the second conductive electrode 1152 and a larger wire resistance is applied to the first conductive electrode 1156c which is closer to the second conductive electrode 1152. For example, as illustrated in FIG. 17B, the n-type contact layer 2153b may be formed in such a manner that as the n-type contact layer 2153b is located farther from the second conductive electrode 1152, a distance between the n-type contact layer and the first conductive electrode is decreased. For another example, as illustrated in FIG. 17C, the n-type contact layer 1156c may be formed to have a different width from each other at a portion facing the plurality of first conductive electrodes 1156a, 1156b, 1156c, respectively.

For another example, according to a structure in which one semiconductor light emitting device takes charge of four or more pixels as illustrated in FIG. 15E, the n-type contact layer of a pixel (first conductive electrode) which is located far from the second conductive electrode may be deposited to be thicker than that of a pixel which is closer to the second conductive electrode. Through this, it may be possible to overcome a difference between wire resistances.

As shown in the above structure, a display device to which a new type semiconductor light emitting device according to the embodiment of the invention is applied may be modified in various forms.

The configurations and methods according to the above-described embodiments will not be applicable in a limited way to the foregoing display device using a semiconductor light emitting device, and all or part of each embodiment may be selectively combined and configured to make various modifications thereto.

What is claimed is:

1. A display device, comprising:
a wiring substrate having a first electrode and a second electrode formed on different surfaces;
a conductive adhesive layer configured to cover the wiring substrate; and
a sub-pixel portion coupled to the conductive adhesive layer to have a plurality of light emitting portions that emit different color lights,
wherein the sub-pixel portion has a plurality of first conductive electrodes corresponding to the plurality of light emitting portions, and a second conductive electrode as a common electrode for the plurality of light emitting portions,
wherein an electrode hole is formed on the wiring substrate to electrically connect the second electrode to the second conductive electrode, and
wherein a semiconductor light emitting device having the plurality of first conductive electrodes and the second conductive electrode is disposed on the sub-pixel portion, and
the semiconductor light emitting device has a plurality of first conductive semiconductor layers on which the plurality of first conductive electrodes are formed, respectively, and a second conductive semiconductor layer on which the second conductive electrode is formed.

2. The display device of claim 1, wherein the second conductive semiconductor layer is a single semiconductor layer, and the plurality of first conductive semiconductor layers are overlapped with the single semiconductor layer.

3. The display device of claim 2, wherein active layers are formed between the second conductive semiconductor layer and the plurality of first conductive semiconductor layers, respectively, to sequentially form the plurality of light emitting portions along a direction parallel to the single semiconductor layer.

4. The display device of claim 1, wherein the second conductive electrode is a single conductive electrode.

5. The display device of claim 1, wherein the second conductive semiconductor layer includes an n-type semiconductor layer and an n-type contact layer, and at least one of a thickness of the n-type contact layer, a width of the n-type contact layer, and a distance between the n-type contact layer and the plurality of first conductive electrodes is formed differently on the plurality of light emitting portions.

6. The display device of claim 1, wherein the plurality of light emitting portions are formed to emit red, green and blue light, respectively.

7. The display device of claim 1, wherein the first electrode and second electrode have first electrode lines and second electrode lines, respectively, and the first electrode lines and second electrode lines are formed in directions crossing each other, and at least part of the first electrode lines and second electrode lines is electrically connected to the sub-pixel portion.

8. The display device of claim 7, wherein the sub-pixel portion is electrically connected to a plurality of electrode lines of the first electrode lines, and electrically connected to a single electrode line of the second electrode lines.

9. The display device of claim 1, wherein the plurality of first conductive electrodes are aligned along a virtual line, and the second conductive electrode is disposed offset from the virtual line.

10. The display device of claim 9, wherein the sub-pixel portion is either one of a first sub-pixel portion and a second sub-pixel portion that are adjacent to each other, and
a second conductive electrode of the first sub-pixel portion and a second conductive electrode of the second sub-pixel portion are sequentially arranged along a direction perpendicular to the virtual line.

11. The display device of claim 10, wherein the electrode hole is extended from the first sub-pixel portion to the second sub-pixel portion to cover the second conductive electrode of the first sub-pixel portion and the second conductive electrodes of the second sub-pixel portion.

12. The display device of claim 9, wherein the sub-pixel portion is either one of a first sub-pixel portion and a second sub-pixel portion that are adjacent to each other, and
the first sub-pixel portion and second sub-pixel portion are formed to share a single second conductive electrode.

13. The display device of claim 12, wherein the first sub-pixel portion and second sub-pixel portion are formed in a horizontal symmetry or both vertical and horizontal symmetry around the single second conductive electrode.

14. The display device of claim 12, wherein the electrode hole is formed to correspond to the single second conductive electrode.

15. A display device, comprising:
a wiring substrate having a first electrode and a second electrode;
a conductive adhesive layer configured to cover the wiring substrate; and
a semiconductor light emitting device coupled to the conductive adhesive layer, and configured to emit light from a plurality of light emitting portions separated from one another, respectively,
wherein the semiconductor light emitting device comprises:
a plurality of first conductive semiconductor layers corresponding to the plurality of light emitting portions, respectively, the plurality of first conductive semiconductor layers being sequentially disposed along at least one line of the first electrode;
a second conductive semiconductor layer overlapped with the plurality of first conductive semiconductor layers;
a plurality of first conductive electrodes electrically connected to the at least one line of the first electrode, and formed on the plurality of first conductive semiconductor layers, respectively; and
a second conductive electrode electrically connected to the second electrode and deposited on the second conductive semiconductor layer.

16. The display device of claim 15, wherein the semiconductor light emitting device forms a sub-pixel portion that emits red light, green light and blue light, and the sub-pixel portion has the plurality of first conductive electrodes and the second conductive electrode.

17. The display device of claim 16, wherein an electrode hole corresponding to the second conductive electrode is formed on the wiring substrate to electrically connect the second electrode to the second conductive electrode on a surface on which the first electrode is formed.

* * * * *